United States Patent [19]

Levin et al.

[11] Patent Number: 5,895,739
[45] Date of Patent: Apr. 20, 1999

[54] ENHANCED PHOTOCONDUCTIVE OXO-TITANYL PHTHALOCYANINE

[75] Inventors: Ronald Harold Levin; Scott Thomas Mosier, both of Boulder; Catherine Mailhé Randolph, Niwot, all of Colo.

[73] Assignee: Lexmark International, Inc., Lexington, Ky.

[21] Appl. No.: 08/978,408

[22] Filed: Nov. 25, 1997

[51] Int. Cl.$^6$ .................................................. G03G 5/07
[52] U.S. Cl. .................................................. 430/78
[58] Field of Search .................................. 430/58, 59, 78

[56] References Cited

U.S. PATENT DOCUMENTS

| | | | |
|---|---|---|---|
| 3,899,329 | 8/1975 | Bean et al. | 96/1.5 |
| 3,982,939 | 9/1976 | Bean | 96/1.5 |
| 4,202,620 | 5/1980 | Klavan et al. | 355/10 |
| 4,268,597 | 5/1981 | Klavan et al. | 430/102 |
| 5,063,126 | 11/1991 | Nakatani et al. | 430/59 |
| 5,069,991 | 12/1991 | Leyrer et al. | 430/49 |
| 5,407,766 | 4/1995 | Mayo et al. | 430/58 |
| 5,744,271 | 4/1998 | Aizawa et al. | 430/58 |

OTHER PUBLICATIONS

Japanese Journal of Applied Physics, vol. 30, No. 7A, Jul., 1991, pp. L 1182–L 1185.

*Primary Examiner*—John Goodrow
*Attorney, Agent, or Firm*—John A. Brady

[57] ABSTRACT

Titanium dioxide added to oxo-titanyl phthalocyanine in a resin binder forming a charge generation layer having significantly improved dark decay and sensitivity. Added sensitivity is obtained when the X-form is precipitated from a dichloromethane/trifluoroacetic acid/oxo-titanyl phthalocyanine mixture by adding a water/methanol mixture containing titanium dioxide.

10 Claims, 3 Drawing Sheets

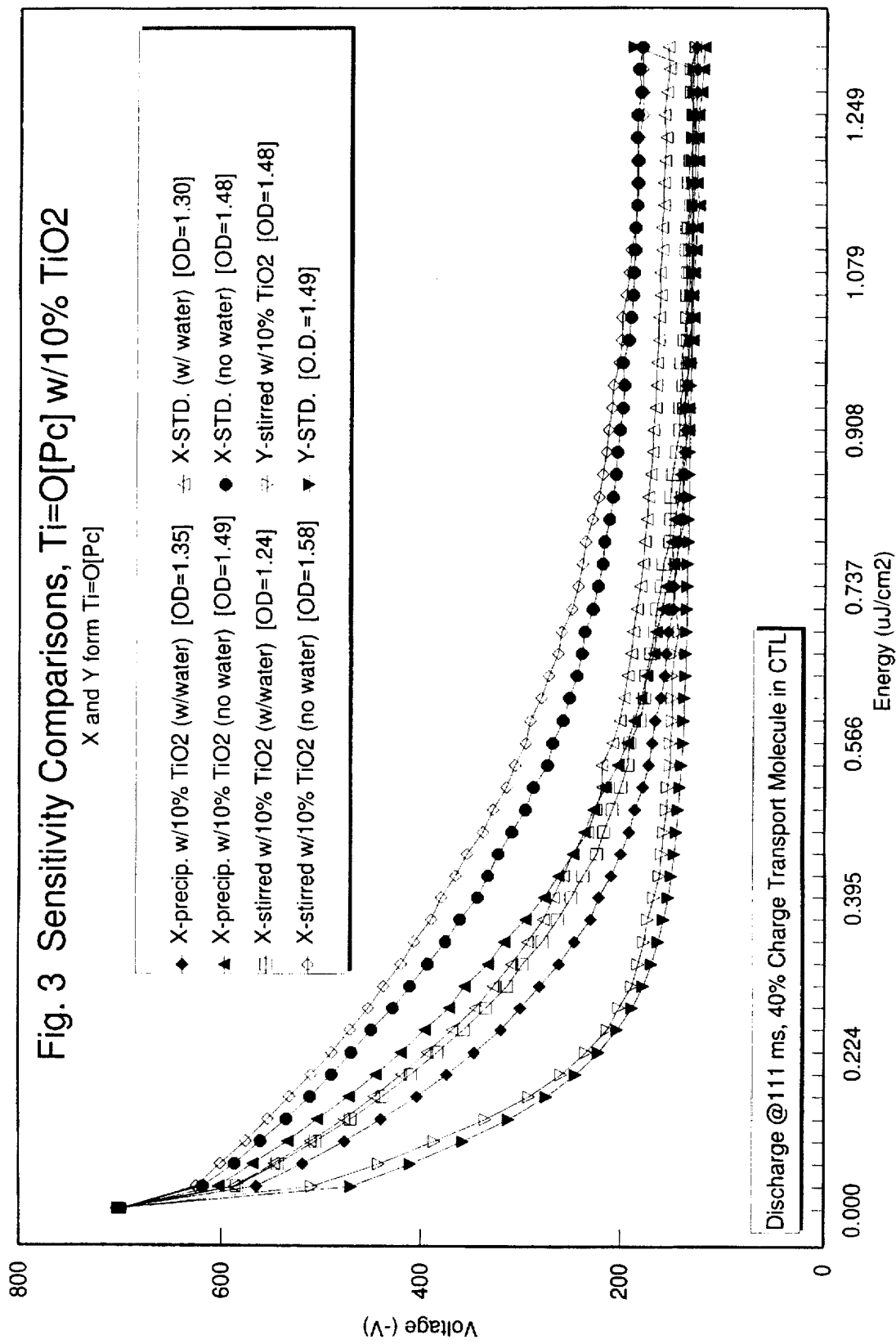

ENHANCED PHOTOCONDUCTIVE OXO-TITANYL PHTHALOCYANINE

TECHNICAL FIELD

This invention relates to photoconductive elements used to form electrostatic images. Such images are rendered visible or stable by applying charged toner on the electrostatic surface.

BACKGROUND OF THE INVENTION

This invention employs the thorough mixture of X-form and/or Y-form oxo-titanyl phthalocyanine and titanium dioxide as the photosensitive material of a photoconductive element. This mixture provides improved dark decay and control of sensitivity. Both oxo-titanyl phthalocyanine and titanium dioxide are known photoconductors, but are not known to provide exceptional functioning when combined. As it is well known, the X-form and Y-form material differ from each other by their crystalline structure, as well as from other crystalline forms of oxo-titanyl phthalocyanine as evidenced by their different X-ray diffraction patterns. They are often referred to as "pigments" even when used as photoconductors.

The addition of alumina to metal-free phthalocyanine and vanadyl phthalocyanine to enhance photoconductivity is reported by Saito et al. in an article entitled "Photocarrier Generation Process of Phthalocyanine Particles Dispersed in a Polymer: Effects of Pigment Particle Size, Polymer Matrix and Addition of Fine γ-Alumina Particles," in *Japanese Journal of Applied Physics*, Vol. 30, No. 7A, July, 1991, pp. L 1182–L 1185.

Phthalocyanine green and phthalocyanine blue (neither of which are X-form or Y-form oxo-titanyl phthalocyanine) are employed together with titanium dioxide in U.S. Pat. Nos. 5,069,992 to Leyrer et al.; 4,268,597 to Klavan et al.; and 4,202,620 to Klavan et al. Phthalocyanine and titanium are employed in separate migration layers in U.S. Pat. No. 3,982,939 to Bean. U.S. Pat. No. 3,899,329 to Bean et al. discloses photosensitive members which have a mixture of photoconductive materials, but not a unique, previously unutilized combination of known photoconductive materials such as X-form or Y-form oxo-titanyl phthalocyanine and titanium dioxide, to achieve improved photoconductive characteristics.

DISCLOSURE OF THE INVENTION

Between 1 and 35 parts by weight of titanium dioxide are added to 100 parts by weight of X-form or Y-form oxo-titanyl phthalocyanine along with 5,000 parts by weight of solvent (50:50 methyl ethyl ketone:cyclohexanone) and the mixture is dispersed using conventional means, for example a paint shaker. The resulting mixture is applied in a standard resin binder as a charge generation layer on a conductive surface, for example the anodized surface of an aluminum drum, and then overcoated with a charge transport layer to form a photoconductive member (typically a drum or a belt) in which electrostatic images are formed by electrostatically charging the photoconductive member and then discharging it by light in the form of the image.

The resulting photoconductor exhibits significantly improved dark decay and its sensitivity may be controlled by proper selection of phthalocyanine polymorph.

BRIEF DESCRIPTION OF THE DRAWINGS

The details of this invention will be described in connection with the accompanying drawings, in which FIG. 3 is a graph of observed sensitivities for different Y-form and X-form variations with and without titanium dioxide.

DESCRIPTION OF PREFERRED EMBODIMENTS

Figure 1:
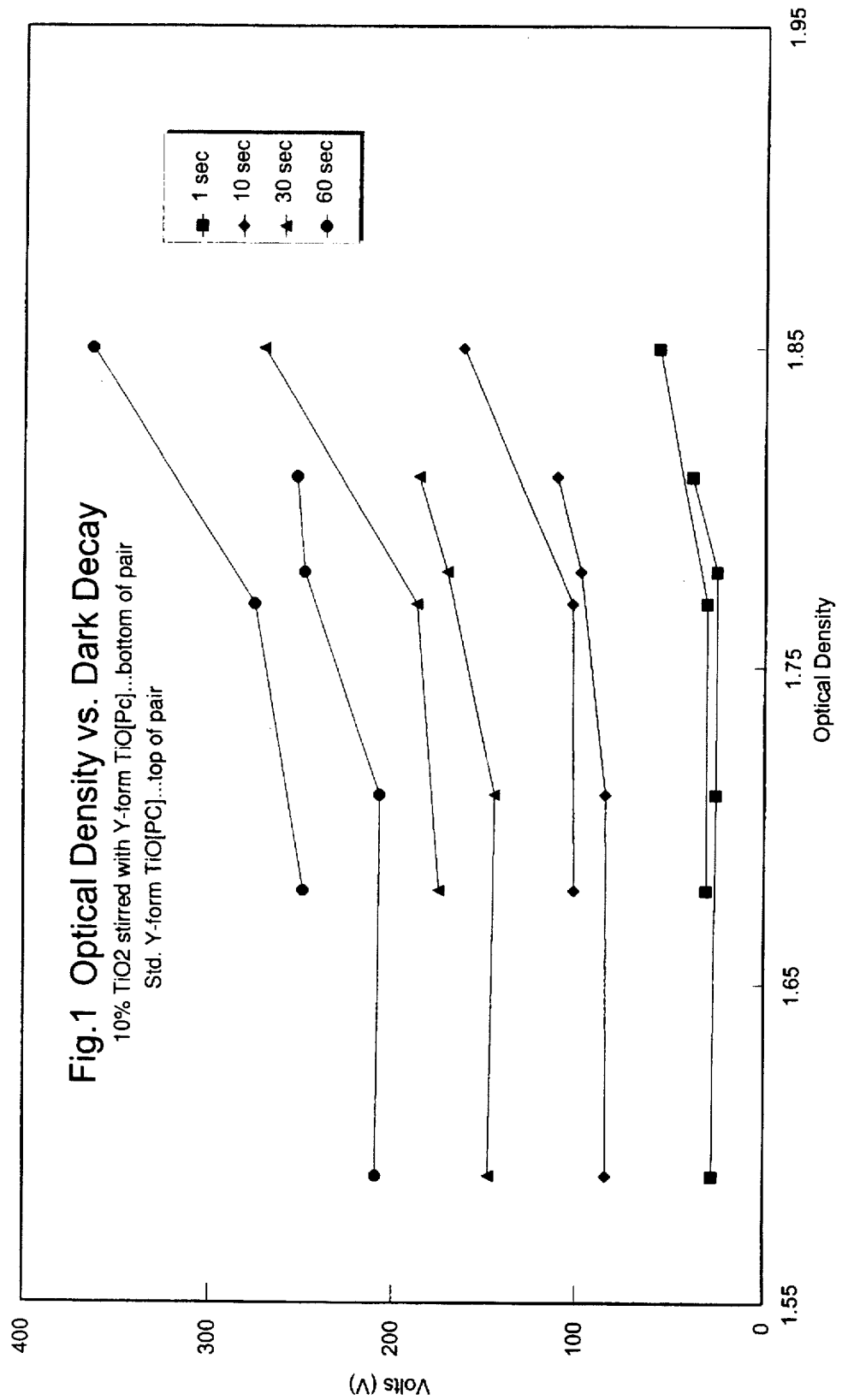
FIG. 1 is a graph of observed optical density versus dark decay for Y-form only compared with Y-form mixed with titanium dioxide.
Figure 2:
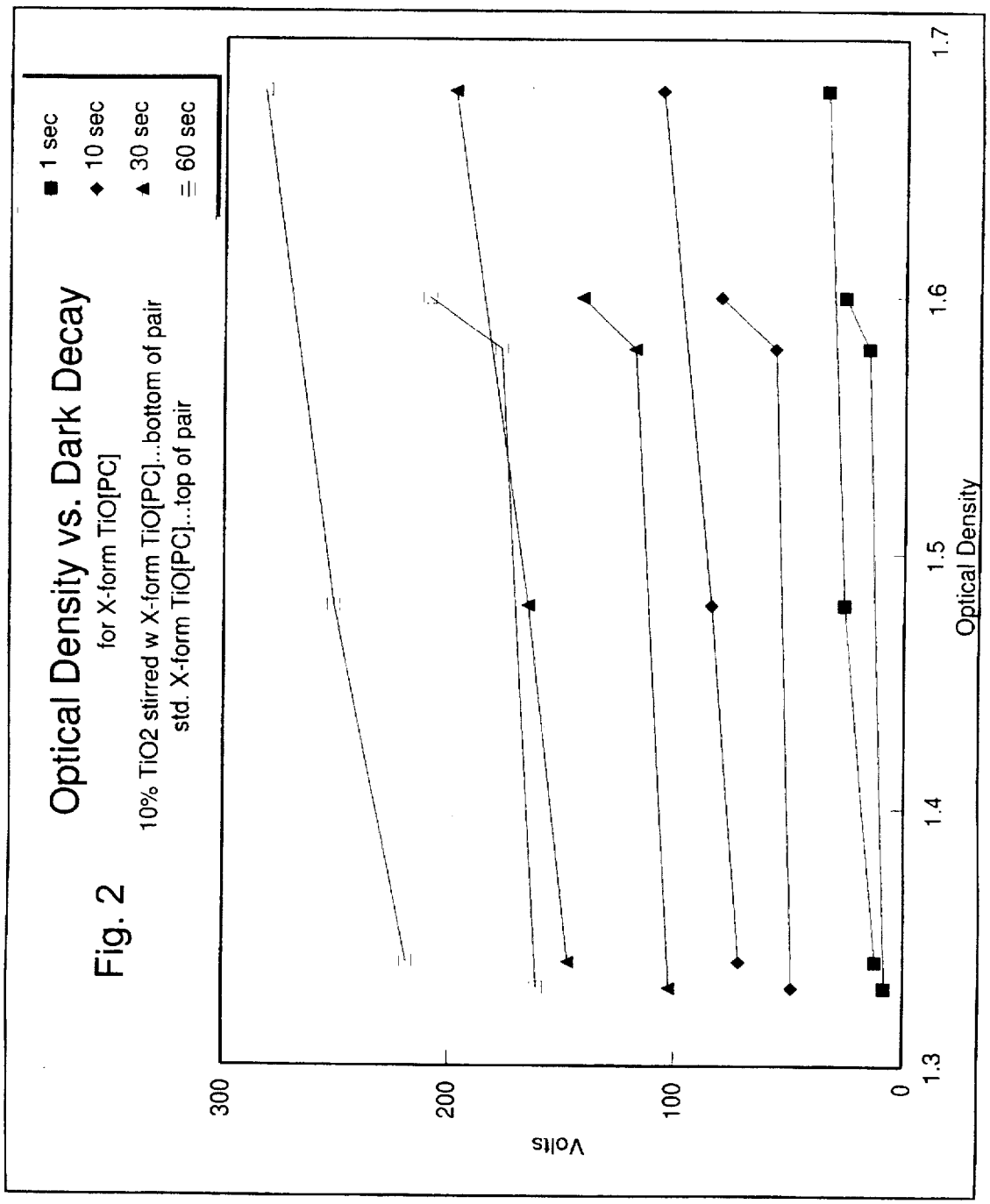
FIG. 2 is a graph of observed optical density versus dark decay for X-form only compared with X form titanium dioxide.

Dark decay, the change in surface voltage over time of a photoconductor after it has been charged, but prior to exposure to light, is an important property of photoconductors. A low value is desirable as it connotes performance stability. FIG. 1 shows the dark decay from a photoconductor fabricated with only Y-form oxo-titanyl phthalocyanine and also shows the same Y-form oxo-titanyl phthalocyanine thoroughly blended with 10% by weight titanium dioxide, both in the same resin binder. In FIG. 1 the dark decay is shown as change in voltage for the standard Y-form only and for the mixture. In each comparison the bottom of the pair of graphs is the mixture. FIG. 2 is similar to FIG. 1 where the oxo-titanyl phthalocyanine is X-form. Comparisons are made at similar optical densities, which removes the phthalocyanine concentration as a variable since the comparisons are being made between samples having the same number of phthalocyanine molecules at the observed locations. The data show that, at all measured times, dark decay is reduced 15 to 40 percent in the titanium dioxide-containing samples. This is not a function of sensitivity (discussed immediately below), as the samples of the same optical density are discharged very similarly in manner and extent.

Sensitivity is the extent of discharge in response to light energy, which is the amount of light energy required to discharge the photoconductor surface potential to a particular predetermined value. FIG. 3 illustrates observed data showing that incorporation of titanium dioxide in combination with various Y-form and X-form oxo-titanyl phthalocyanines provides for considerable flexibility in ability to adjust or "tune" the photoconductor sensitivity. The sensitivity may be adjusted from faster than standard sample to slower (X-form precipitated with 10% titanium dioxide, no water at 1.49 optical density is more sensitive (faster) than standard X-form, no water at 1.48 optical density, which, in turn, is faster than X-form stirred with 10% titanium dioxide, no water at 1.58 optical density).

In the case of X-form oxo-titanyl phthalocyanine, the mode of addition of titanium dioxide influences the sensitivity: the sensitivity is typically higher when titanium dioxide is added during the acid pasting step, than when titanium dioxide simply is added to the X-form. The acid pasting procedure in the presence of titanium dioxide is as follows: The X-form oxo-titanyl phthalocyanine is dissolved in a dichloromethane/trifluoroacetic acid mixture (4:1 by volume). The solution is then added rapidly, with stirring, to a water/methanol mixture (1:1 by volume) containing titanium dioxide. Precipitation of the X-form pigment in this case occurs in the presence of titanium dioxide.

Fast and slow relate to the shape (slope) of the voltage versus exposure curve. A fast photoconductor has a high slope, which is useful in what are termed "binary applications," where a pixel is either black or white, shades of gray are unimportant in "binary printing" applications. On the other hand, a slower photoconductor is needed in applications where continuous toner reproduction is desired, in which case shades of gray are required. As demonstrated, titanium dioxide doping permits "tuning" or adjustment of photoconductor sensitivity across a wide range, a very desirable and novel feature.

An additional desirable feature of the foregoing formulations containing titanium dioxide, is their low residual voltage. Low residual voltage is a desirable feature because it equates with the photoconductor having operated in an efficient manner. As can be seen in FIG. 3, in the majority of cases studied, the titanium dioxide-doped photoconductors have a lower residual voltage than the standards.

Further observation indicates that between 1 and 35% by weight of titanium dioxide with respect to the total weight of the phthalocyanine and the titanium dioxide beneficially may be employed. Both the anatase and rutile polymorphs of titanium dioxide are usable alone or in combination. The p-25 product of Degussa, which is 70% by weight anatase and 30% by weight rutile, generally produces better results.

Similar results with respect to dark decay have not been observed where the titanium dioxide is replaced by alumina particles, zinc oxide (studied at a laser light wavelength to which both titanium dioxide and zinc oxide are transparent) and other minerals. Similarly, where titanium dioxide is replaced by polyvinylbutyral, no effect on dark decay or sensitivity appeared, showing that the improved results from titanium dioxide are not the result of simple thickening of the charge generation layer.

Other specific implementations will be apparent and can be anticipated.

We claim:

1. A photosensitive element comprising a mixture of oxo-titanyl phthalocyanine and a titanium dioxide, said titanium dioxide being in an amount of from about 1 to 35 percent by weight of the total weight of said phthalocyanine and said titanium dioxide.

2. The photoconductive element as in claim 1 in which said titanium dioxide is a mixture of anatase titanium dioxide and rutile titanium dioxide.

3. The photoconductive element as in claim 2 in which said mixture of anatase and rutile is about 7 parts by weight anatase and 3 parts by weight rutile.

4. The photoconductive element as in claim 1 in which said phthalocyanine is X-form.

5. The photoconductive element as in claim 4 in which said X-form phthalocyanine is precipitated from a chloromethane/fluoroacetic acid mixture by addition of a water/methanol mixture in the presence of said titanium dioxide.

6. The photoconductive element as in claim 4 in which said titanium dioxide is a mixture of anatase titanium dioxide and rutile titanium dioxide.

7. The photoconductive element as in claim 6 in which said mixture of anatase and rutile is about 7 parts by weight anatase and 3 parts by weight rutile.

8. The photoconductive element as in claim 1 in which said phthalocyanine is Y-form.

9. The photoconductive element as in claim 8 in which said titanium dioxide is a mixture of anatase titanium dioxide and rutile titanium dioxide.

10. The photoconductive element as in claim 9 in which said mixture of anatase and rutile is about 7 parts by weight anatase and 3 parts by weight rutile.

* * * * *